United States Patent
Saito et al.

(10) Patent No.: US 7,883,750 B2
(45) Date of Patent: *Feb. 8, 2011

(54) THIN FILMS AND A METHOD FOR PRODUCING THE SAME

(75) Inventors: Takao Saito, Nagoya (JP); Yukinori Nakamura, Nagoya (JP); Yoshimasa Kondo, Nagoya (JP); Naoto Ohtake, Yokosuka (JP)

(73) Assignee: NGK Insulators, Ltd., Nagoya (JP)

( * ) Notice: Subject to any disclaimer, the term of this patent is extended or adjusted under 35 U.S.C. 154(b) by 802 days.

This patent is subject to a terminal disclaimer.

(21) Appl. No.: 10/774,454

(22) Filed: Feb. 10, 2004

(65) Prior Publication Data

US 2004/0161534 A1 Aug. 19, 2004

(30) Foreign Application Priority Data

Feb. 18, 2003 (JP) ............................ P2003-039304
Aug. 20, 2003 (JP) ............................ P2003-295768

(51) Int. Cl.
C23C 16/00 (2006.01)
H05H 1/24 (2006.01)

(52) U.S. Cl. .................. 427/569; 427/249.1; 427/249.7

(58) Field of Classification Search ................. 427/569, 427/249.7, 902, 906
See application file for complete search history.

(56) References Cited

U.S. PATENT DOCUMENTS 5,711,814 A 1/1998 Mori

2002/0170495 A1 11/2002 Nakamura et al.

FOREIGN PATENT DOCUMENTS

| DE | 195 13 614 C1 | 10/1996 |
|---|---|---|
| DE | 100 55 609 A1 | 5/2002 |
| JP | H9-104985 | 4/1997 |
| JP | 09-259431 | 10/1997 |
| JP | 11-12735 | * 1/1999 |
| JP | 11-256331 | 9/1999 |
| JP | 2001-220681 | 8/2001 |

(Continued)

OTHER PUBLICATIONS

Mizuno et al., Characterization of Ultra-short Pulsed Discharge Plasma for CVD Processing, IEEE Transaction on Industry Applications, Volu 29, No. 3 May/Jun. 1993. pp. 656-660.*

(Continued)

*Primary Examiner*—David Turocy
(74) *Attorney, Agent, or Firm*—Burr & Brown

(57) ABSTRACT

An object of the present invention is to provide a method of forming a thin film of excellent quality by generating discharge plasma using gaseous raw material including a carbon source under an atmosphere of a relatively high pressure of 100 Torr or higher. A substrate 6 is mounted on at least one of opposing electrodes 4 and 5. A pulse voltage is applied on the opposing electrodes 4 and 5 under a pressure of 100 to 1600 Torr in an atmosphere containing gaseous raw material "A" including a carbon source to generate discharge plasma. A thin film 7 is thus formed on the substrate 6. The pulse voltage has a pulse duration of 10 to 1000 nsec.

4 Claims, 4 Drawing Sheets

FOREIGN PATENT DOCUMENTS

| | | |
|---|---|---|
| JP | 2002-339072 | 11/2002 |
| JP | 2003-019433 | 1/2003 |
| JP | 2003-328137 | 11/2003 |

OTHER PUBLICATIONS

Awazu et al. DLC films formed by hybrid pulse plasma coating (HPPC) system. Surface and Coatings Technology 136 2001 pp. 172-175.*

Hartmann et al. Deposition of thick diamond films by pulsed d.c. glow discharge CVD. Diamond and Related Materials 5 (1996) 850-856.*

Tither et al. Hybrid plasma CVD of diamond-like carbon (DLC) at low temperatures. Journal of Materials Science 32 (1997) 1931-1936.*

Tither et al. Application of diamond-like carbon coatings deposited by plasma-assisted chemical vapour deposition onto metal matrix composites for two-stroke engine components. Journal of Materials Science Letters 14 (1995) 1062-1064.*

P. Hartman et al., "Deposition of thick diamond films by pulsed d.c. glow discharge CVD", Diamonds and related Materials, vol. 5, pp. 850-856 (1996).

* cited by examiner

THIN FILMS AND A METHOD FOR PRODUCING THE SAME

This application claims the benefits of Japanese Patent Applications P2003-295, 768 filed on Aug. 20, 2003, and P2003-39, 304, filed on Feb. 18, 2003, the entireties of which are incorporated by reference.

BACKGROUND OF THE INVENTION

1. Field of the Invention

The present invention provides a method of producing a thin film applying discharge plasma under a pressure of, for example, ambient pressure.

2. Related Art Statement

Japanese patent publication 11-12735A discloses a trial for forming a thin film of diamond like carbon by generating discharge plasma under a pressure near ambient pressure. According to the method, gaseous raw material was supplied to a space between opposing electrodes, and a pulse voltage is applied on the opposing electrodes to generate discharge plasma between the opposing electrodes. A thin film is thus formed. The thus obtained thin film is analyzed by Raman spectroscopic analysis, so that it is confirmed the presence of a peak value (1332 $cm^{-1}$) attributed to diamond, according to the description (0049) of the publication.

SUMMARY OF THE INVENTION

So called diamond like carbon (DLC) exhibits, however, a main peak at a wave number of about 1580 $cm^{-1}$ and a shoulder peak at a wave number of about 1300 to 1500 $cm^{-1}$ or so. It is considered that the thin film described in the publication is different from a normal diamond like carbon and of lower quality.

An object of the present invention is to provide a method of forming a thin film of excellent quality by generating discharge plasma using gaseous raw material including a carbon source under an atmosphere of a relatively high pressure of 100 Torr or higher.

The present invention provides a method of producing a thin film using opposing electrodes. According to the method, a pulse voltage is applied on opposing electrodes under a pressure of 100 to 1600 Torr in an atmosphere comprising gaseous raw material including a carbon source to generate a thin film on a substrate. The pulse voltage has a pulse duration of 10 to 1000 nsec.

The present invention further provides a thin film obtained by the method.

The present inventors have found the followings. That is, when a film is formed by plasma CVD process under a high pressure condition of 100 Torr or higher, the quality of film proved to be considerably improved by reducing the pulse duration of the applied pulse voltage to 1000 nsec or shorter. The present invention is based on the discovery. It is thus possible to form a diamond like carbon film of high quality at a substrate temperature of 20 to 300° C., for example.

The strength of the thus obtained film can be improved to, for example, 10 GPa. A strength of 10 GPa is sufficient for providing characteristic properties as diamond like carbon.

These and other objects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

According to the present invention, plasma is generated in a space between opposing electrodes. A substrate is provided on at lease one of the opposing electrodes. A separate substrate may be provided on the other of the opposing electrodes. The opposing electrodes may be of plane parallel plate type, cylinder parallel plate type, sphere parallel plate type, hyperbola parallel plate type, or coaxial cylinder type.

Either or both of the opposing electrodes may be covered with a solid dielectric material. Such solid dielectric material includes a plastics such as polytetrafluoroethylene, polyethyleneterephthalate etc., a metal oxide such as a glass, silicon dioxide, aluminum oxide, zirconium dioxide, titanium dioxide etc., and a composite oxide such as barium titanate etc.

The shape of the substrate is not particularly limited. The thickness of the substrate may preferably be 0.05 to 4 mm. A distance between the opposing electrodes is not particularly limited, and may preferably be 1 to 50 mm. The substrate may be made of a material including a plastics such as polyethylene, polypropylene, polystyrene, polycarbonate, polyethylene terephthalate, polyphenylene sulfide, polyether ether ketone, polytetrafluoroethylene, an acrylic resin etc., a glass, a ceramic material and a metal. The shape of the substrate is not particularly limited and may be various three-dimensional shapes such as a plate, film or the like.

According to the present invention, a pulse voltage is applied on the opposing electrodes to generate plasma. The waveform of the pulse voltage is not particularly limited, and may be of impulse, square wave (rectangular wave), or modulated wave type. A direct current bias voltage may be preferably applied with the application of the pulse voltage.

According to the present invention, the pulse voltage has a pulse duration time of 10 to 1000 nsec. The quality of the thin film can be improved by providing the pulse duration of 1000 nsec or shorter. On the viewpoint, the pulse duration may preferably be 500 nsec or shorter, and more preferably be 300 nsec or shorter. It may be not practical to reduce the pulse duration to a value lower than 10 nsec. In Japanese patent publication 11-12735A, it is described that the preferred range of the pulse duration of the pulse voltage is 1 to 1000 μsec, and more preferably be 3 to 200 μsec. The pulse duration is 20 μsec in the example. It is also described the reason that the discharge may be unstable and the film formation becomes difficult when the pulse duration is shorter than 1 μsec.

Figure 1:
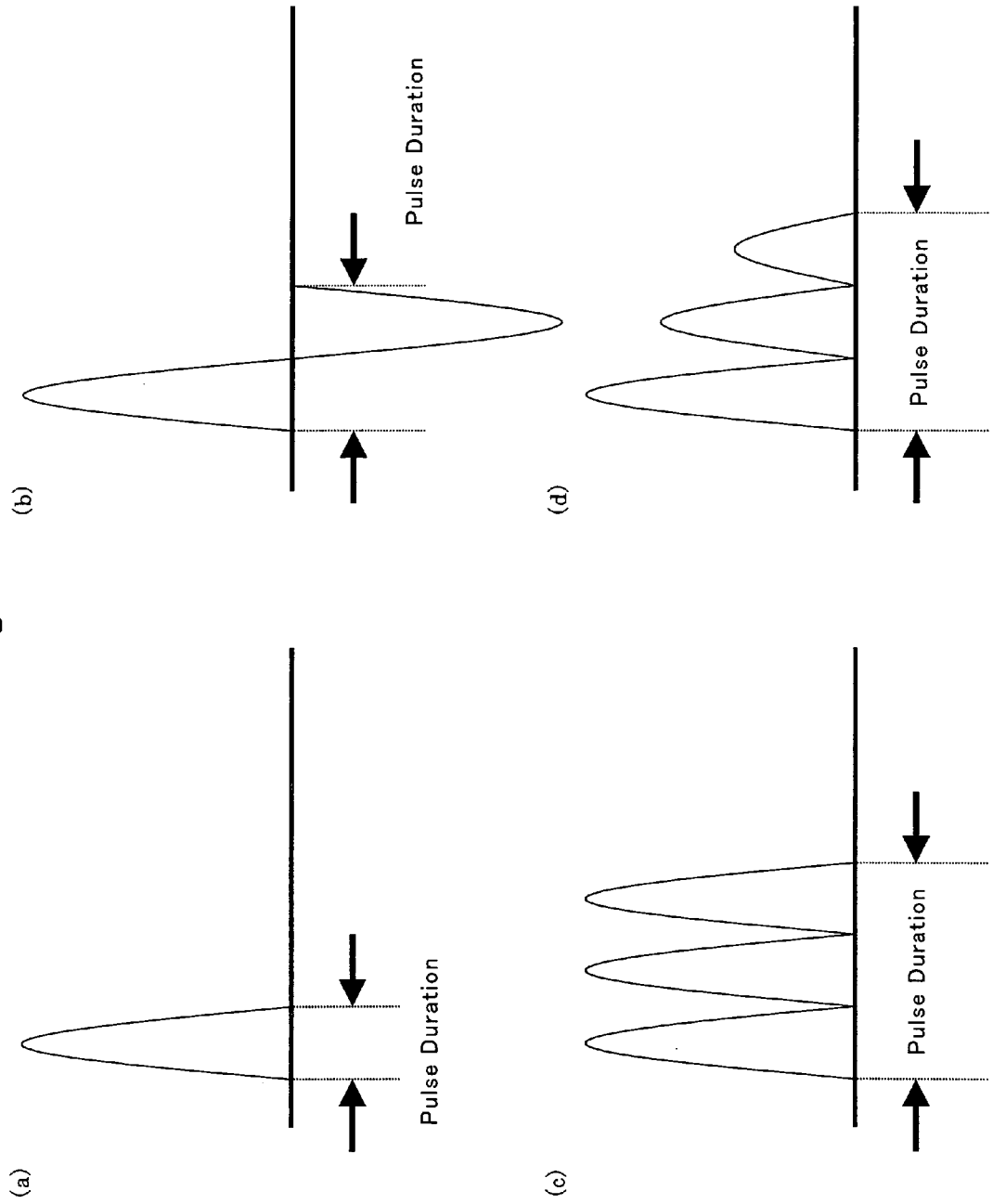
FIGS. 1(a), 1(b), 1(c) and 1(d) are graphs each showing the relationship between waveform and pulse duration.

The pulse duration means a time duration where a pulse or pulses is continued in a pulse voltage including cycles of "ON" and "OFF". When the pulse voltage is of a damped waveform, a series of pulses are continuously damped to form one damped wave as a whole. In this case, the pulse duration in the present invention means a duration of the damped wave composed of a series of waves continuously damped from the initial to terminating waves. For example, in a waveform shown in FIG. 1(a), each pulse includes one rise part and one fall part. The pulse duration of the invention means a time duration from the start point to the terminating point of each pulse. In a waveform shown in FIG. 1(b), two pulses (first and second pulses) are continued and each of the first and second pulses includes one rise part and one fall part. The pulse duration of the invention means a time duration from the starting point of the first pulse to the terminating point of the second pulse. In a waveform shown in FIG. 1(c), three pulses (first, second and third) pulses are continued and each of the first, second and third pulses includes one rise part and one fall part. The pulse duration of the invention means a time duration from the starting point of the first pulse to the terminating point of the third pulse. In a waveform shown in FIG. 1(d), three pulses (first, second and third) pulses are continued to from a damped waveform. Each of the first, second and third pulses includes one rise part and one fall part. The pulse duration of the invention means a time duration from the starting point of the first pulse to the terminating point of the third pulse.

The pulse voltage may preferably have a frequency of 1 to 100 kHz. When the frequency is lower than 1 kHz, a long time in needed to complete the plasma CVD process. When the frequency is higher than 100 kHz, arc discharge tends to be generated.

The field intensity of the electric field is not particularly limited. For example, the field intensity between the opposing electrodes may preferably be 1 to 100 kV/cm.

The pulse voltage may be applied with an electric source for generating pulse with a short rise time as described above. Such electric source includes a source using a static induction thyristor device without the need of a mechanism for magnetic pressure, a thyratron equipped with a mechanism for magnetic pressure, a gap switching device, IGBT device, MOF-FET device, or a source using a static induction thyristor device.

The pressure of the atmosphere according to the present invention is 100 to 1600 Torr. The pressure may preferably be 600 to 900 Torr on the viewpoint of improving the productivity.

Gaseous raw material containing a carbon source is used in the present invention. The carbon source includes the followings.

An alcohol such as methanol, ethanol or the like.
An alkane such as methane, ethane, propane, butane, pentane, hexane or the like.
An alkene such as ethylene, propylene, betene, pentene or the like.
An alkadiene such as pentadiene, butadiene or the like.
An alkyne such as acetyrene, methyl acetyrene or the like.
An aromatic hydrocarbon such as benzene, toluene, xylene, indene, naphthalene, phenanthrene or the like.
A cycloalkane such as cyclopropane, cyclohexane or the like.
An cycloalkene such as cyclopentene, cyclohexene or the like.
At lease one of the following gases may be used in addition to the carbon source.
(a) Oxygen gas
(b) Hydrogen gas Oxygen and hydrogen gases are converted to atoms in the discharge plasma to remove graphite formed accompanied with the formation of diamond.
(c) Carbon monooxide, carbon dioxide
(d) Dilution gas When the carbon source and carbon dioxide are used, a mixed ratio (carbon source gas/carbon dioxide gas) may preferably be 1/1 to 1/3 (volume ratio).

The content of the carbon source in the gaseous raw material may preferably be 2 to 80 vol. %.

The content of oxygen gas or hydrogen gas in the atmosphere may preferably be 70 vol. % or lower.

The dilution gas may be at least one of gases of elements belonging to the group VIII of the Periodic Table, such as helium, argon, neon and xenon, and nitrogen gas. The content of the dilution gas in the atmosphere of gaseous raw material may preferably be 20 to 90 vol. %.

Further, a gas containing boron element or phosphorus element such as diborane ($BH_3BH_3$), trimethyl boron ($B(CH_3)_3$), phosphine ($PH_3$), methyl phosphine ($CH_3PH_2$) or the like, or nitrogen gas may be added to gas atmosphere where the discharge occurs.

Figure 2:
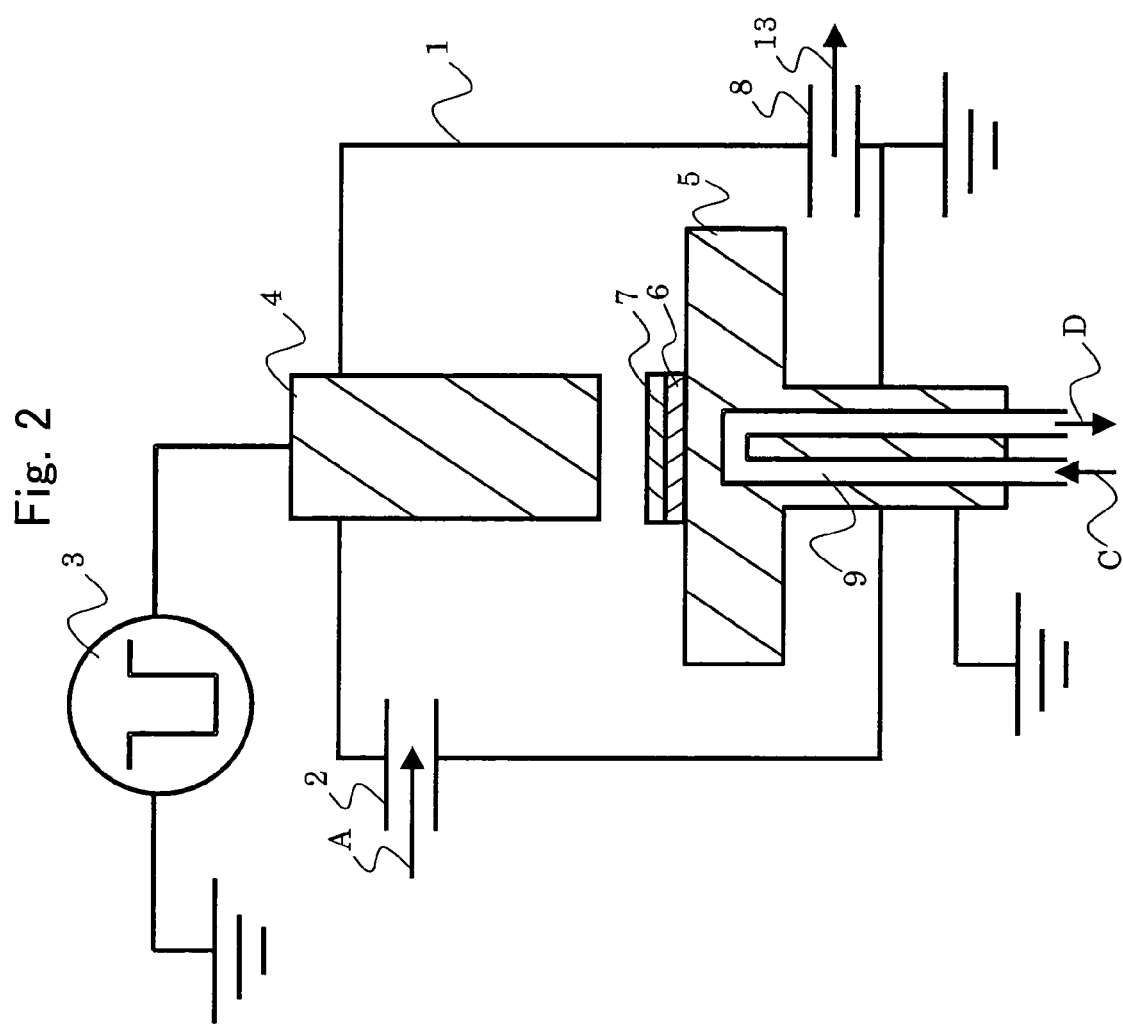
FIG. 2 is a diagram schematically showing a system for forming a film utilized for carrying out the present invention.

FIG. 2 is a diagram schematically showing a system usable for carrying out the present invention. A film is formed in a chamber 1. A substrate 6 is mounted on a lower electrode 5 and opposes an upper electrode 4 to form a space, where discharge plasma is generated. A gaseous raw material is supplied from a gas supply hole 2 of the chamber 1 as an arrow A into the chamber 1. A pulse voltage is applied on the upper and lower electrodes by means of an electric source 3 utilizing an static induction thyristor device to generate plasma. A thin film 7 is thus formed on the substrate 6. Used gas is discharged from a discharge hole 8 as an arrow B. A communicating route 9 of a cooling medium is formed in the lower electrode 5, so that the cooling medium is flown in the communicating route 9 as arrows C and D. It is thus possible to control the temperature of the substrate 6 at a specific value of, for example, 20 to 300° C.

The gaseous raw material may be supplied into the chamber 1 after mixing. Alternatively, when the gaseous raw material includes two or more kinds of gases and a dilution gas, each of the gases and dilution gas may be supplied into the chamber 1 through the corresponding separate supply hole.

The thin film produced by the present invention may be composed of diamond like carbon. Alternatively, the thin film may be an amorphous silicon film (a-Si:H), or an amorphous film of BCN, BN, CN or the like.

EXAMPLES

Example 1

The system explained referring to FIG. 2 was used to produce a thin film of diamond like carbon as described above. An electric source utilizing a static induction thyristor device was used as the electric source 3. The chamber 1 was made of stainless steel. The lower electrode 5 had a diameter of 50 mm. The surface of the substrate 5 was covered with a dielectric material. The substrate 6 composed of a silicon substrate was mounted on the electrode 5. The upper electrode 4 was provided over the surface of the substrate 6 at a height of 10 mm. The surface of the upper electrode 4 had a diameter of 10 mm.

An oil-sealed rotary vacuum pump was used to evacuate the chamber 1 until the pressure in the chamber 1 reaches 0.1 Torr. Helium gas was then supplied into the chamber 1 through the supply hole of helium until the pressure in the chamber 1 reaches about 300 Torr. A pulse voltage was applied on the upper electrode 4 and lower electrode 5 while a mixed gas of 20 sccm of methane gas and 100 sccm of helium gas was introduced through the gas supply hole 2. The pulse voltage had a peak value of −15 kV, a frequency of 1000 Hz, a rise time of 150 nsec, a fall time of 150 nsec, and a pulse duration of 300 nsec. The pulse voltage was applied so that electric discharge was maintained for 10 minutes to form a thin film 7 of diamond like carbon.

Figure 3:
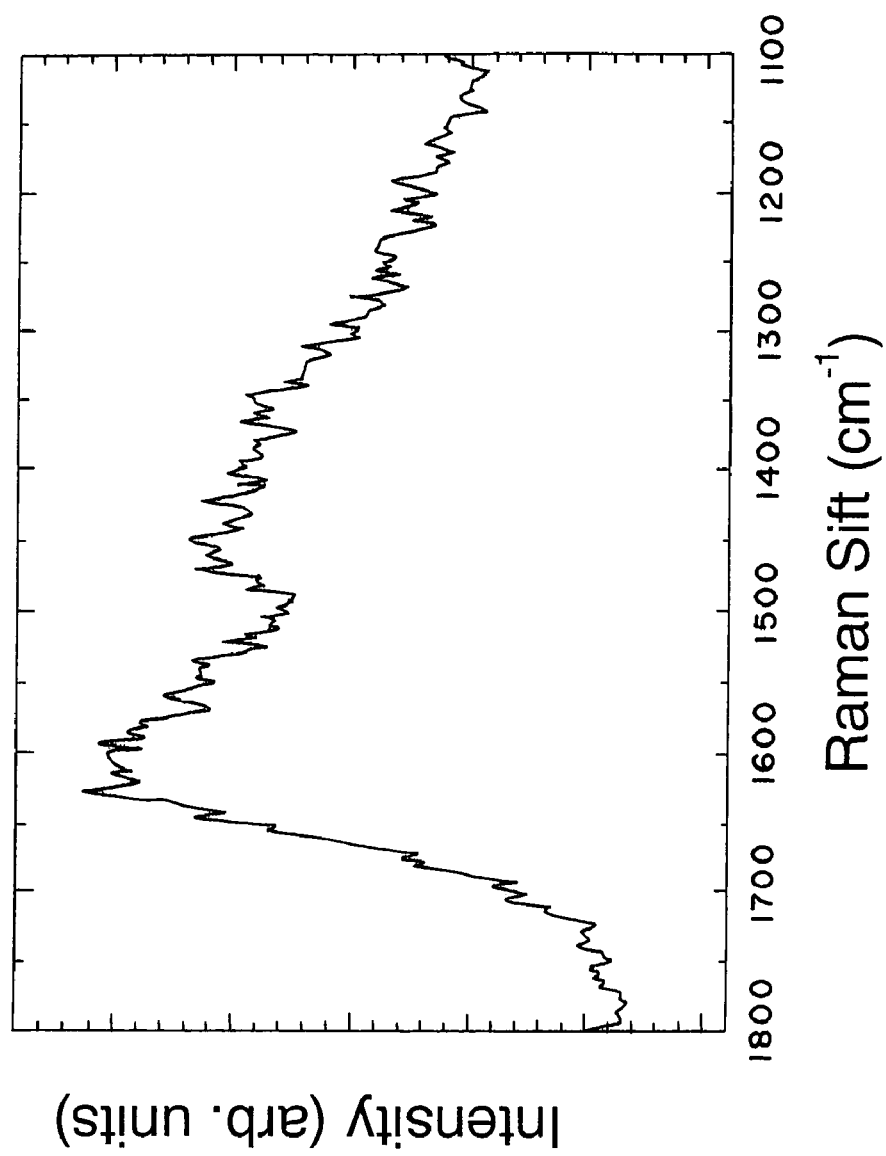
FIG. 3 is a Raman spectrum of a thin film of diamond like carbon.

The thus obtained film was subjected to Raman spectroscopic analysis using a system for Raman spectroscopy (supplied by JASCO Corporation: "NRS-1000"). The results were shown in FIG. 3. As a result, a shoulder peak was confirmed at a wave number of 1350 to 1450 $cm^{-1}$, as well as a main peak at about 1580 $cm^{-1}$, to prove that the thus obtained film was of excellent quality.

Example 2

Figure 4:
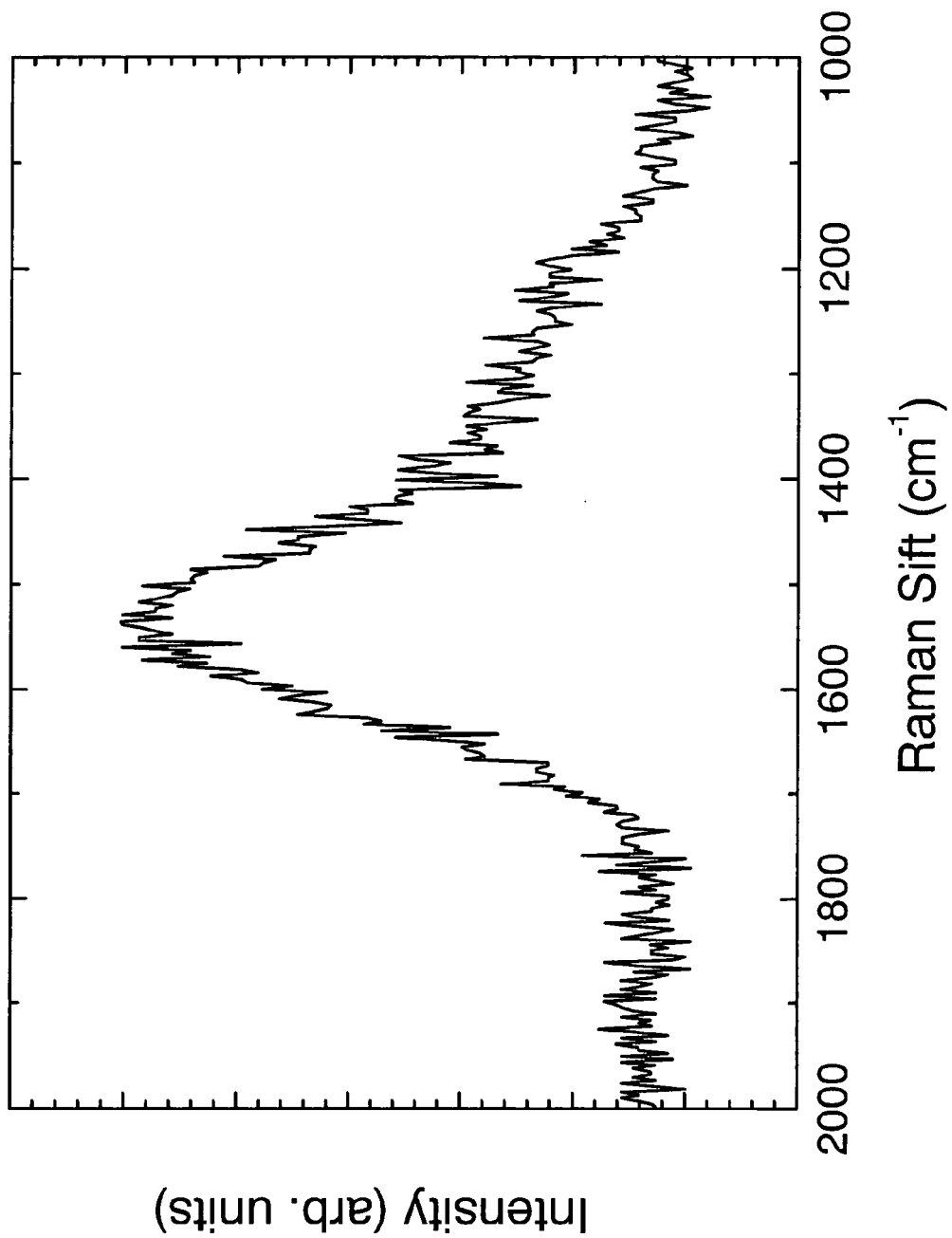
FIG. 4 is a Raman spectrum of a thin film of diamond like carbon.

A thin film of diamond like carbon was formed according to the same procedure as the example 1, except that the electric discharge was continued for a longer time of 60 minutes. The thus obtained thin film was subjected to Raman spectroscopic analysis as described in the example 1. The results were shown in FIG. 4. A "D" band at a wave number of about 1330 $cm^{-1}$ and a "G" band at a wavelength of about 1580 $cm^{-1}$ were clearly confirmed, without the shoulder shown in FIG. 3 between the "D" and "G" bands. It was thus proved that the film quality was excellent.

The hardness and elastic modulus of the thus obtained thin film were measured using "Nano Indenter XP" (supplied by MTS systems corporation). The hardness proved to be as high as 20.8 GPa and the elastic modulus was 185 GPa. It has not been reported a diamond like film having such a high hardness obtained by a process under ambient pressure. The thin film had a center line surface roughness Ra of 0.4 nm and a thickness of 1.6 µm.

As described above, the present invention provides a method of forming a thin film of excellent quality by generating discharge plasma using gaseous raw material containing a carbon source under an atmosphere of a relatively high pressure of 100 Torr or higher.

The present invention has been explained referring to the preferred embodiments. However, the present invention is not limited to the illustrated embodiments which are given by way of examples only, and may be carried out in various modes without departing from the scope of the invention.

The invention claimed is:

1. A method of producing a thin film using opposing first and second electrodes, said method comprising the step of:

applying a pulse voltage on said opposing electrodes under a pressure of 100 to 1600 Torr in an atmosphere consisting of a carbon source gas and helium gas to generate discharge plasma so that a thin film, comprising diamond like carbon that is amorphous diamond like carbon having a Raman spectrum comprising a main peak at about a wave number of 1580 $cm^{-1}$ and a shoulder peak in a wave number range of 1300 $cm^{-1}$ to 1500 $cm^{-1}$, is formed on a substrate, wherein said pulse voltage is an impulse voltage and has a pulse duration shorter than 1000 nsec and said opposing first and second electrodes are free from any coatings.

2. The method of claim 1, wherein said substrate has a temperature of 20° C. to 300° C.

3. A method of producing a thin film using opposing first and second electrodes, said method comprising the step of:

applying a pulse voltage on said opposing electrodes under a pressure of 100 to 1600 Torr in an atmosphere consisting of a carbon source gas and helium gas to generate discharge plasma so that a thin film, comprising diamond like carbon that is amorphous diamond like carbon having a Raman spectrum comprising a main peak at about a wave number of 1580 $cm^{-1}$ and a shoulder peak in a wave number range of 1300 $cm^{-1}$ to 1500 $cm^{-1}$, is formed on a substrate, wherein said pulse voltage in an impulse voltage and has a pulse duration shorter than 500 nsec and said opposing first and second electrodes are free from any coatings.

4. The method of claim 3, wherein said substrate has a temperature of 20° C. to 300° C.

* * * * *